(12) United States Patent
Weinberg et al.

(10) Patent No.: US 11,915,771 B2
(45) Date of Patent: Feb. 27, 2024

(54) VOLTAGE DETECTION FOR MANAGED MEMORY SYSTEMS

(71) Applicant: Micron Technology, Inc., Boise, ID (US)

(72) Inventors: Yoav Weinberg, Toronto (CA); Evgeni Bassin, Pleasanton, CA (US)

(73) Assignee: Micron Technology, Inc., Boise, ID (US)

( * ) Notice: Subject to any disclaimer, the term of this patent is extended or adjusted under 35 U.S.C. 154(b) by 168 days.

(21) Appl. No.: 17/655,138

(22) Filed: Mar. 16, 2022

(65) Prior Publication Data

US 2023/0207032 A1 Jun. 29, 2023

Related U.S. Application Data

(60) Provisional application No. 63/266,151, filed on Dec. 29, 2021.

(51) Int. Cl.
*G11C 5/14* (2006.01)
*G11C 29/02* (2006.01)

(52) U.S. Cl.
CPC ............ *G11C 29/021* (2013.01); *G11C 5/144* (2013.01); *G11C 29/028* (2013.01)

(58) Field of Classification Search
CPC ...... G11C 29/021; G11C 29/028; G11C 5/144
See application file for complete search history.

(56) References Cited

U.S. PATENT DOCUMENTS

| | | | | |
|---|---|---|---|---|
| 5,382,839 A * | 1/1995 | Shinohara | ............. | G11C 5/147 327/530 |
| 5,805,473 A * | 9/1998 | Hadderman | ........... | G11C 5/141 340/636.15 |
| 6,606,705 B1 * | 8/2003 | Volk | .................... | G06F 13/4072 710/52 |
| 9,836,110 B2 * | 12/2017 | Mickelsen | ................ | G06F 1/30 |
| 9,997,249 B2 * | 6/2018 | Pao | ....................... | G11C 16/225 |
| 10,191,535 B2 * | 1/2019 | Sun | ........................ | G06F 1/3296 |
| 10,339,979 B2 * | 7/2019 | Aftabjahani | ............ | G06F 21/81 |
| 2013/0346670 A1 * | 12/2013 | Wang | ...................... | G06F 1/305 711/E12.008 |

* cited by examiner

*Primary Examiner* — Son L Mai
(74) *Attorney, Agent, or Firm* — Holland & Hart LLP

(57) ABSTRACT

Methods, systems, and devices for voltage detection for managed memory systems are described. In some cases, a memory system may include circuitry to monitor one or more supply voltages to the memory system or voltages generated by the memory system to determine whether a voltage rises above an operational range. In some cases, an overvoltage detector may include an undervoltage detector that has been tuned or manufactured to have a higher threshold than an undervoltage detector used to determine whether a voltage has fallen below the operational range. Accordingly, the memory system may monitor a voltage using an undervoltage detector having a threshold corresponding to a lower bound or lower operation point of the operational range of the monitored voltage and an overvoltage detectors having a threshold corresponding to the upper bound or upper operational point of the operational range.

25 Claims, 7 Drawing Sheets

VOLTAGE DETECTION FOR MANAGED MEMORY SYSTEMS

CROSS REFERENCE

The present Application for Patent claims the benefit of U.S. Provisional Patent Application No. 63/266,151 by WEINBERG et al., entitled "VOLTAGE DETECTION FOR MANAGED MEMORY SYSTEMS," filed Dec. 29, 2021, assigned to the assignee hereof, and expressly incorporated by reference herein.

FIELD OF TECHNOLOGY

The following relates generally to one or more systems for memory and more specifically to voltage detection for managed memory systems.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often corresponding to a logic 1 or a logic 0. In some examples, a single memory cell may support more than two possible states, any one of which may be stored by the memory cell. To access information stored by a memory device, a component may read, or sense, the state of one or more memory cells within the memory device. To store information, a component may write, or program, one or more memory cells within the memory device to corresponding states.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), 3-dimensional cross-point memory (3D cross point), not-or (NOR) and not-and (NAND) memory devices, and others. Memory devices may be volatile or non-volatile. Volatile memory cells (e.g., DRAM cells) may lose their programmed states over time unless they are periodically refreshed by an external power source. Non-volatile memory cells (e.g., NAND memory cells) may maintain their programmed states for extended periods of time even in the absence of an external power source.

DETAILED DESCRIPTION

Figure 1:
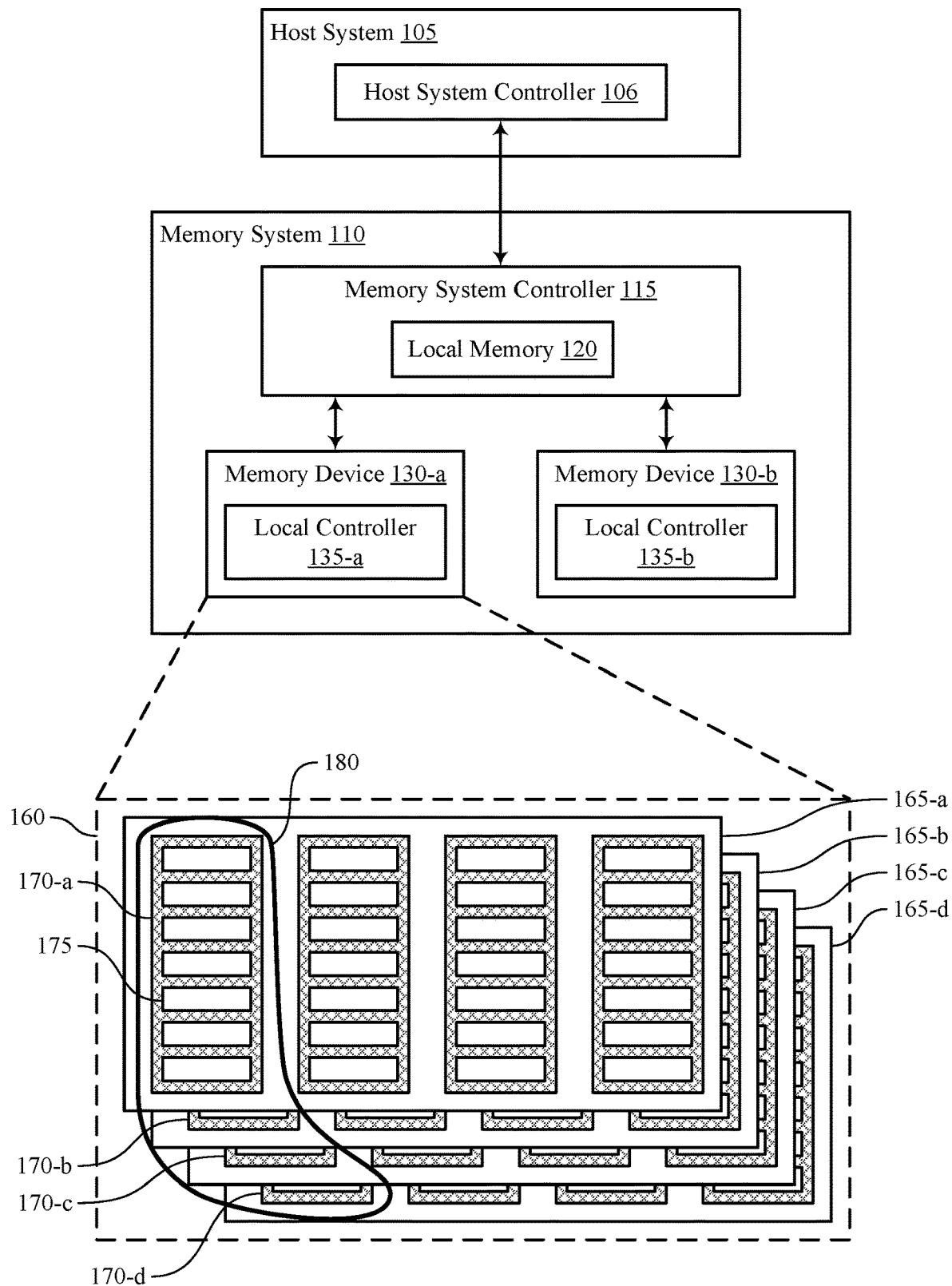
FIG. 1 illustrates an example of a system that supports voltage detection for managed memory systems in accordance with examples as disclosed herein.

Some memory systems, such as managed memory systems, may receive one or more supply voltages, for example from a host system or other external power supply. In some cases, the supply voltages may unexpectedly drop or change in value. For example, electrical connections for the supply voltages may be weak or faulty, which may result in a drop in the power supply. Additionally, if the memory system or other systems drawing from the host system or external power supply activates multiple features, or multiple devices simultaneously draw power from the external power supply, the supply voltages may drop. Alternatively, if multiple devices drawing power from the external power supply are simultaneously turned off, the supply voltages may unexpectedly increase or spike, which may damage or cause erratic behavior in the memory system. In some cases, a memory system may include undervoltage detectors to monitor supply voltages of the memory system, as well as undervoltage detectors to monitor voltages generated by the memory system. The under voltage detectors may notify a health engine of the memory system if a supply voltage falls below a threshold of the undervoltage detector (e.g., if an undervoltage event is detected). The health engine may accordingly initiate a safe state or safe mode for the memory system. However, memory systems such as managed memory systems may not include circuitry to determine whether a supply voltage rises above an operating range. Thus, some memory systems may be susceptible to overvoltage events. Techniques to detect overvoltage events are desired.

As described herein, a memory system may include circuitry, such as an overvoltage detector, to monitor one or more supply voltages to the memory system or voltages generated by the memory system to determine whether a voltage rises above an operational range. In some cases, an overvoltage detector may include a same voltage detector circuit as an undervoltage detector that has been tuned or manufactured to have a higher threshold than an undervoltage detector used to determine whether a voltage has fallen below the operational range. The threshold of a voltage detector may be determined by the configuration of the voltage detector, such as one or more active resistors of the voltage detectors or a trim of the resistors. The configuration may be determined during manufacturing or testing of the memory system, so that the voltage detector may be "tuned" or set to have a desired threshold. Accordingly, the memory system may monitor a voltage using an undervoltage detector having a threshold corresponding to a lower bound or lower operation point of the operational range of the monitored voltage and an overvoltage detector having a threshold corresponding to the upper bound or upper operational point of the operational range. Thus, the memory system may determine whether a monitored voltage rises either above or below the operational range, which may allow a health engine of the memory system to initiate a safe mode or take other action if an overvoltage event is detected or if an undervoltage event is detected.

Figure 2:
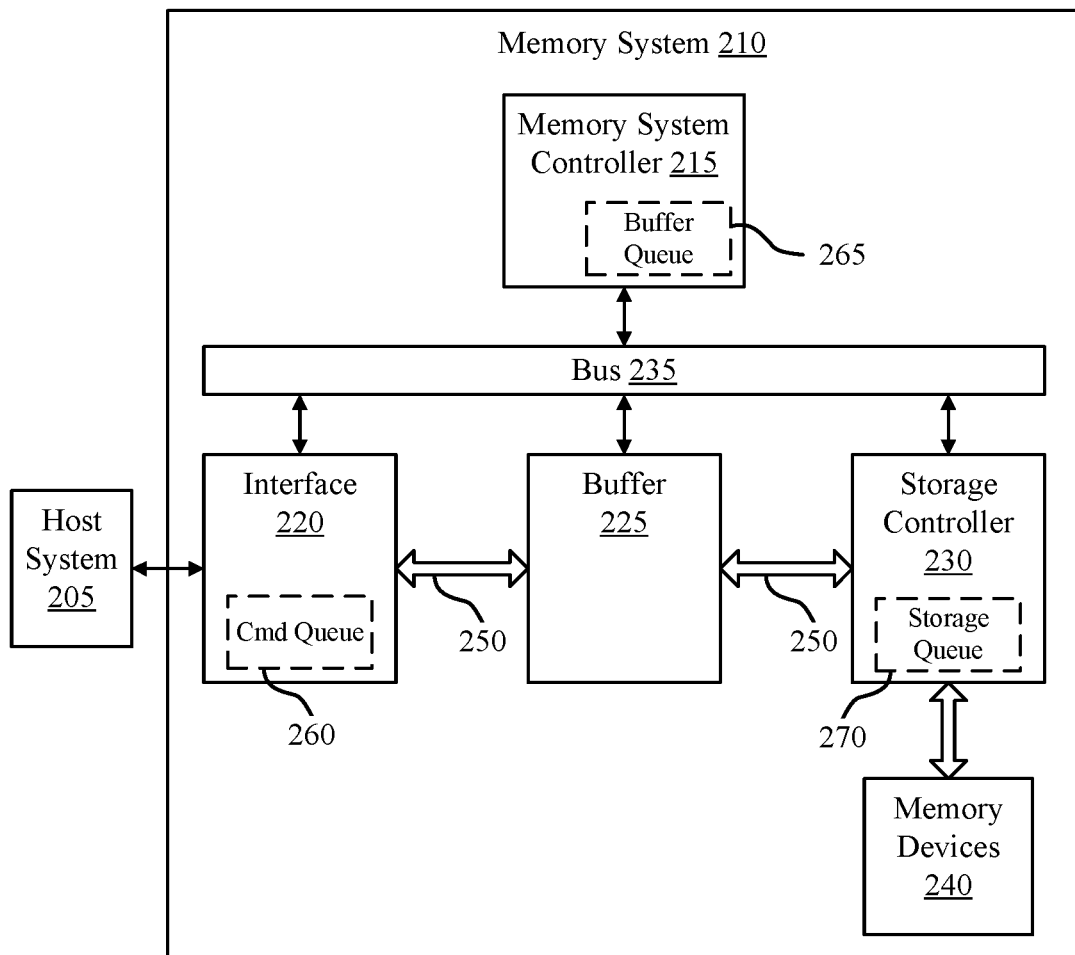
FIG. 2 illustrates an example of a system that supports voltage detection for managed memory systems in accordance with examples as disclosed herein.

Features of the disclosure are initially described in the context of systems, devices, and circuits with reference to FIGS. 1 through 2. Features of the disclosure are described in the context of block diagrams and a flow diagram with reference to FIGS. 3-5. These and other features of the disclosure are further illustrated by and described in the context of an apparatus diagram and flowchart that relate to voltage detection for managed memory systems with reference to FIGS. 6-7.

FIG. 1 illustrates an example of a system 100 that supports voltage detection for managed memory systems in accordance with examples as disclosed herein. The system 100 includes a host system 105 coupled with a memory system 110.

A memory system 110 may be or include any device or collection of devices, where the device or collection of devices includes at least one memory array. For example, a memory system 110 may be or include a Universal Flash Storage (UFS) device, an embedded Multi-Media Controller (eMMC) device, a flash device, a universal serial bus (USB) flash device, a secure digital (SD) card, a solid-state drive (SSD), a hard disk drive (HDD), a dual in-line memory module (DIMM), a small outline DIMM (SO-DIMM), or a non-volatile DIMM (NVDIMM), among other possibilities.

The system 100 may be included in a computing device such as a desktop computer, a laptop computer, a network server, a mobile device, a vehicle (e.g., airplane, drone, train, automobile, or other conveyance), an Internet of Things (IoT) enabled device, an embedded computer (e.g., one included in a vehicle, industrial equipment, or a networked commercial device), or any other computing device that includes memory and a processing device.

The system 100 may include a host system 105, which may be coupled with the memory system 110. In some examples, this coupling may include an interface with a host system controller 106, which may be an example of a controller or control component configured to cause the host system 105 to perform various operations in accordance with examples as described herein. The host system 105 may include one or more devices, and in some cases may include a processor chipset and a software stack executed by the processor chipset. For example, the host system 105 may include an application configured for communicating with the memory system 110 or a device therein. The processor chipset may include one or more cores, one or more caches (e.g., memory local to or included in the host system 105), a memory controller (e.g., NVDIMM controller), and a storage protocol controller (e.g., peripheral component interconnect express (PCIe) controller, serial advanced technology attachment (SATA) controller). The host system 105 may use the memory system 110, for example, to write data to the memory system 110 and read data from the memory system 110. Although one memory system 110 is shown in FIG. 1, the host system 105 may be coupled with any quantity of memory systems 110.

The host system 105 may be coupled with the memory system 110 via at least one physical host interface. The host system 105 and the memory system 110 may in some cases be configured to communicate via a physical host interface using an associated protocol (e.g., to exchange or otherwise communicate control, address, data, and other signals between the memory system 110 and the host system 105). Examples of a physical host interface may include, but are not limited to, a SATA interface, a UFS interface, an eMMC interface, a PCIe interface, a USB interface, a Fiber Channel interface, a Small Computer System Interface (SCSI), a Serial Attached SCSI (SAS), a Double Data Rate (DDR) interface, a DIMM interface (e.g., DIMM socket interface that supports DDR), an Open NAND Flash.

Interface (ONFI), and a Low Power Double Data Rate (LPDDR) interface. In some examples, one or more such interfaces may be included in or otherwise supported between a host system controller 106 of the host system 105 and a memory system controller 115 of the memory system 110. In some examples, the host system 105 may be coupled with the memory system 110 (e.g., the host system controller 106 may be coupled with the memory system controller 115) via a respective physical host interface for each memory device 130 included in the memory system 110, or via a respective physical host interface for each type of memory device 130 included in the memory system 110.

The memory system 110 may include a memory system controller 115 and one or more memory devices 130. A memory device 130 may include one or more memory arrays of any type of memory cells (e.g., non-volatile memory cells, volatile memory cells, or any combination thereof). Although two memory devices 130-a and 130-b are shown in the example of FIG. 1, the memory system 110 may include any quantity of memory devices 130. Further, if the memory system 110 includes more than one memory device 130, different memory devices 130 within the memory system 110 may include the same or different types of memory cells.

The memory system controller 115 may be coupled with and communicate with the host system 105 (e.g., via the physical host interface) and may be an example of a controller or control component configured to cause the memory system 110 to perform various operations in accordance with examples as described herein. The memory system controller 115 may also be coupled with and communicate with memory devices 130 to perform operations such as reading data, writing data, erasing data, or refreshing data at a memory device 130—among other such operations—which may generically be referred to as access operations. In some cases, the memory system controller 115 may receive commands from the host system 105 and communicate with one or more memory devices 130 to execute such commands (e.g., at memory arrays within the one or more memory devices 130). For example, the memory system controller 115 may receive commands or operations from the host system 105 and may convert the commands or operations into instructions or appropriate commands to achieve the desired access of the memory devices 130. In some cases, the memory system controller 115 may exchange data with the host system 105 and with one or more memory devices 130 (e.g., in response to or otherwise in association with commands from the host system 105). For example, the memory system controller 115 may convert responses (e.g., data packets or other signals) associated with the memory devices 130 into corresponding signals for the host system 105.

The memory system controller 115 may be configured for other operations associated with the memory devices 130. For example, the memory system controller 115 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., logical block addresses (LBAs)) associated with commands from the host system 105 and physical addresses (e.g., physical block addresses) associated with memory cells within the memory devices 130.

The memory system controller 115 may include hardware such as one or more integrated circuits or discrete components, a buffer memory, or a combination thereof. The hardware may include circuitry with dedicated (e.g., hard-coded) logic to perform the operations ascribed herein to the memory system controller 115. The memory system controller 115 may be or include a microcontroller, special purpose logic circuitry (e.g., a field programmable gate array (FPGA), an application specific integrated circuit (ASIC), a digital signal processor (DSP)), or any other suitable processor or processing circuitry.

The memory system controller 115 may also include a local memory 120. In some cases, the local memory 120 may include read-only memory (ROM) or other memory that may store operating code (e.g., executable instructions) executable by the memory system controller 115 to perform functions ascribed herein to the memory system controller 115. In some cases, the local memory 120 may additionally or alternatively include static random access memory (SRAM) or other memory that may be used by the memory system controller 115 for internal storage or calculations, for example, related to the functions ascribed herein to the memory system controller 115. Additionally or alternatively, the local memory 120 may serve as a cache for the memory system controller 115. For example, data may be stored in the local memory 120 if read from or written to a memory device 130, and the data may be available within the local memory 120 for subsequent retrieval for or manipulation (e.g., updating) by the host system 105 (e.g., with reduced latency relative to a memory device 130) in accordance with a cache policy.

Although the example of the memory system 110 in FIG. 1 has been illustrated as including the memory system controller 115, in some cases, a memory system 110 may not include a memory system controller 115. For example, the memory system 110 may additionally or alternatively rely upon an external controller (e.g., implemented by the host system 105) or one or more local controllers 135, which may be internal to memory devices 130, respectively, to perform the functions ascribed herein to the memory system controller 115. In general, one or more functions ascribed herein to the memory system controller 115 may in some cases instead be performed by the host system 105, a local controller 135, or any combination thereof. In some cases, a memory device 130 that is managed at least in part by a memory system controller 115 may be referred to as a managed memory device. An example of a managed memory device is a managed NAND (MNAND) device.

A memory device 130 may include one or more arrays of non-volatile memory cells. For example, a memory device 130 may include NAND (e.g., NAND flash) memory, ROM, phase change memory (PCM), self-selecting memory, other chalcogenide-based memories, ferroelectric random access memory (RAM) (FeRAM), magneto RAM (MRAM), NOR (e.g., NOR flash) memory, Spin Transfer Torque (STT)-MRAM, conductive bridging RAM (CBRAM), resistive random access memory (RRAM), oxide based RRAM (OxRAM), electrically erasable programmable ROM (EEPROM), or any combination thereof. Additionally or alternatively, a memory device 130 may include one or more arrays of volatile memory cells. For example, a memory device 130 may include RAM memory cells, such as dynamic RAM (DRAM) memory cells and synchronous DRAM (SDRAM) memory cells.

In some examples, a memory device 130 may include (e.g., on a same die or within a same package) a local controller 135, which may execute operations on one or more memory cells of the respective memory device 130. A local controller 135 may operate in conjunction with a memory system controller 115 or may perform one or more functions ascribed herein to the memory system controller 115. For example, as illustrated in FIG. 1, a memory device 130-*a* may include a local controller 135-*a* and a memory device 130-*b* may include a local controller 135-*b*.

In some cases, a memory device 130 may be or include a NAND device (e.g., NAND flash device). A memory device 130 may be or include a memory die 160. For example, in some cases, a memory device 130 may be a package that includes one or more dies 160. A die 160 may, in some examples, be a piece of electronics-grade semiconductor cut from a wafer (e.g., a silicon die cut from a silicon wafer). Each die 160 may include one or more planes 165, and each plane 165 may include a respective set of blocks 170, where each block 170 may include a respective set of pages 175, and each page 175 may include a set of memory cells.

In some cases, a NAND memory device 130 may include memory cells configured to each store one bit of information, which may be referred to as single level cells (SLCs). Additionally or alternatively, a NAND memory device 130 may include memory cells configured to each store multiple bits of information, which may be referred to as multi-level cells (MLCs) if configured to each store two bits of information, as tri-level cells (TLCs) if configured to each store three bits of information, as quad-level cells (QLCs) if configured to each store four bits of information, or more generically as multiple-level memory cells. Multiple-level memory cells may provide greater density of storage relative to SLC memory cells but may, in some cases, involve narrower read or write margins or greater complexities for supporting circuitry.

In some cases, planes 165 may refer to groups of blocks 170, and in some cases, concurrent operations may take place within different planes 165. For example, concurrent operations may be performed on memory cells within different blocks 170 so long as the different blocks 170 are in different planes 165. In some cases, an individual block 170 may be referred to as a physical block, and a virtual block 180 may refer to a group of blocks 170 within which concurrent operations may occur. For example, concurrent operations may be performed on blocks 170-*a*, 170-*b*, 170-*c*, and 170-*d* that are within planes 165-*a*, 165-*b*, 165*c*, and 165-*d*, respectively, and blocks 170-*a*, 170-*b*, 170-*c*, and 170-*d* may be collectively referred to as a virtual block 180. In some cases, a virtual block may include blocks 170 from different memory devices 130 (e.g., including blocks in one or more planes of memory device 130-*a* and memory device 130-*b*). In some cases, the blocks 170 within a virtual block may have the same block address within their respective planes 165 (e.g., block 170-*a* may be "block 0" of plane 165-*a*, block 170-*b* may be "block 0" of plane 165-*b*, and so on). In some cases, performing concurrent operations in different planes 165 may be subject to one or more restrictions, such as concurrent operations being performed on memory cells within different pages 175 that have the same page address within their respective planes 165 (e.g., related to command decoding, page address decoding circuitry, or other circuitry being shared across planes 165).

In some cases, a block 170 may include memory cells organized into rows (pages 175) and columns (e.g., strings, not shown). For example, memory cells in a same page 175 may share (e.g., be coupled with) a common word line, and memory cells in a same string may share (e.g., be coupled with) a common digit line (which may alternatively be referred to as a bit line).

For some NAND architectures, memory cells may be read and programmed (e.g., written) at a first level of granularity (e.g., at the page level of granularity) but may be erased at a second level of granularity (e.g., at the block level of granularity). That is, a page 175 may be the smallest unit of memory (e.g., set of memory cells) that may be independently programmed or read (e.g., programed or read concurrently as part of a single program or read operation), and a block 170 may be the smallest unit of memory (e.g., set of memory cells) that may be independently erased (e.g., erased concurrently as part of a single erase operation). Further, in some cases, NAND memory cells may be erased before they can be re-written with new data. Thus, for example, a used page 175 may in some cases not be updated until the entire block 170 that includes the page 175 has been erased.

In some cases, a memory system controller 115 or a local controller 135 may perform operations (e.g., as part of one or more media management algorithms) for a memory device 130, such as wear leveling, background refresh, garbage collection, scrub, block scans, health monitoring, or others, or any combination thereof. For example, within a memory device 130, a block 170 may have some pages 175 containing valid data and some pages 175 containing invalid data. To avoid waiting for all of the pages 175 in the block 170 to have invalid data in order to erase and reuse the block 170, an algorithm referred to as "garbage collection" may be invoked to allow the block 170 to be erased and released as a free block for subsequent write operations. Garbage collection may refer to a set of media management operations that include, for example, selecting a block 170 that contains valid and invalid data, selecting pages 175 in the block that contain valid data, copying the valid data from the selected pages 175 to new locations (e.g., free pages 175 in another block 170), marking the data in the previously selected pages 175 as invalid, and erasing the selected block 170. As a result, the quantity of blocks 170 that have been erased may be increased such that more blocks 170 are available to store subsequent data (e.g., data subsequently received from the host system 105).

The system 100 may include any quantity of non-transitory computer readable media that support voltage detection for managed memory systems. For example, the host system 105, the memory system controller 115, or a memory device 130 (e.g., a local controller 135) may include or otherwise may access one or more non-transitory computer readable media storing instructions (e.g., firmware) for performing the functions ascribed herein to the host system 105, memory system controller 115, or memory device 130. For example, such instructions, if executed by the host system 105 (e.g., by the host system controller 106), by the memory system controller 115, or by a memory device 130 (e.g., by a local controller 135), may cause the host system 105, memory system controller 115, or memory device 130 to perform one or more associated functions as described herein.

In some cases, a memory system 110 may utilize a memory system controller 115 to provide a managed memory system that may include, for example, one or more memory arrays and related circuitry combined with a local (e.g., on-die or in-package) controller (e.g., local controller 135). An example of a managed memory system is a managed NAND (MNAND) system.

In some cases, a memory system 110 may include circuitry, such as an overvoltage detector, to monitor one or more supply voltages to the memory system 110 or voltages generated by the memory system 110 to determine whether a voltage rises above an operational range. In some cases, an overvoltage detector may include a same voltage detector circuit as an undervoltage detector that has been tuned or manufactured to have a higher threshold than an undervoltage detector used to determine whether a voltage has fallen below the operational range. Accordingly, the memory system 110 may monitor a voltage using an undervoltage detector having a threshold corresponding to a lower bound or lower operation point of the operational range of the monitored voltage and an overvoltage detector having a threshold corresponding to the upper bound or upper operational point of the operational range. Thus, the memory system 110 may determine whether a monitored voltage rises either above or below the operational range, which may allow a health engine of the memory system 110 to initiate a safe mode or take other action if an overvoltage event is detected or if an undervoltage event is detected.

FIG. 2 illustrates an example of a system 200 that supports voltage detection for managed memory systems in accordance with examples as disclosed herein. The system 200 may be an example of a system 100 as described with reference to FIG. 1 or aspects thereof. The system 200 may include a memory system 210 configured to store data received from the host system 205 and to send data to the host system 205, if requested by the host system 205 using access commands (e.g., read commands or write commands). The system 200 may implement aspects of the system 100 as described with reference to FIG. 1. For example, the memory system 210 and the host system 205 may be examples of the memory system 110 and the host system 105, respectively.

The memory system 210 may include memory devices 240 to store data transferred between the memory system 210 and the host system 205, e.g., in response to receiving access commands from the host system 205, as described herein. The memory devices 240 may include one or more memory devices as described with reference to FIG. 1. For example, the memory devices 240 may include NAND memory, PCM, self-selecting memory, 3D cross point, other chalcogenide-based memories, FERAM, MRAM, NOR (e.g., NOR flash) memory, STT-MRAM, CBRAM, RRAM, or OxRAM.

The memory system 210 may include a storage controller 230 for controlling the passing of data directly to and from the memory devices 240, e.g., for storing data, retrieving data, and determining memory locations in which to store data and from which to retrieve data. The storage controller 230 may communicate with memory devices 240 directly or via a bus (not shown) using a protocol specific to each type of memory device 240. In some cases, a single storage controller 230 may be used to control multiple memory devices 240 of the same or different types. In some cases, the memory system 210 may include multiple storage controllers 230, e.g., a different storage controller 230 for each type of memory device 240. In some cases, a storage controller 230 may implement aspects of a local controller 135 as described with reference to FIG. 1.

The memory system 210 may additionally include an interface 220 for communication with the host system 205 and a buffer 225 for temporary storage of data being transferred between the host system 205 and the memory devices 240. The interface 220, buffer 225, and storage controller 230 may be for translating data between the host system 205 and the memory devices 240, e.g., as shown by a data path 250, and may be collectively referred to as data path components.

Using the buffer 225 to temporarily store data during transfers may allow data to be buffered as commands are being processed, thereby reducing latency between commands and allowing arbitrary data sizes associated with commands. This may also allow bursts of commands to be handled, and the buffered data may be stored or transmitted (or both) once a burst has stopped. The buffer 225 may include relatively fast memory (e.g., some types of volatile memory, such as SRAM or DRAM) or hardware accelerators or both to allow fast storage and retrieval of data to and from the buffer 225. The buffer 225 may include data path switching components for bi-directional data transfer between the buffer 225 and other components.

The temporary storage of data within a buffer 225 may refer to the storage of data in the buffer 225 during the execution of access commands. That is, upon completion of an access command, the associated data may no longer be maintained in the buffer 225 (e.g., may be overwritten with data for additional access commands). In addition, the buffer 225 may be a non-cache buffer. That is, data may not be read directly from the buffer 225 by the host system 205. For example, read commands may be added to a queue without an operation to match the address to addresses already in the buffer 225 (e.g., without a cache address match or lookup operation).

The memory system 210 may additionally include a memory system controller 215 for executing the commands received from the host system 205 and controlling the data path components in the moving of the data. The memory system controller 215 may be an example of the memory system controller 115 as described with reference to FIG. 1. A bus 235 may be used to communicate between the system components.

In some cases, one or more queues (e.g., a command queue 260, a buffer queue 265, and a storage queue 270) may be used to control the processing of the access commands and the movement of the corresponding data. This may be beneficial, e.g., if more than one access command from the host system 205 is processed concurrently by the memory system 210. The command queue 260, buffer queue 265, and storage queue 270 are depicted at the interface 220, memory system controller 215, and storage controller 230, respectively, as examples of a possible implementation. However, queues, if used, may be positioned anywhere within the memory system 210.

Data transferred between the host system 205 and the memory devices 240 may take a different path in the memory system 210 than non-data information (e.g., commands, status information). For example, the system components in the memory system 210 may communicate with each other using a bus 235, while the data may use the data path 250 through the data path components instead of the bus 235. The memory system controller 215 may control how and if data is transferred between the host system 205 and the memory devices 240 by communicating with the data path components over the bus 235 (e.g., using a protocol specific to the memory system 210).

If a host system 205 transmits access commands to the memory system 210, the commands may be received by the interface 220, e.g., according to a protocol (e.g., a UFS protocol or an eMMC protocol). Thus, the interface 220 may be considered a front end of the memory system 210. Upon receipt of each access command, the interface 220 may communicate the command to the memory system controller 215, e.g., via the bus 235. In some cases, each command may be added to a command queue 260 by the interface 220 to communicate the command to the memory system controller 215.

The memory system controller 215 may determine that an access command has been received based on the communication from the interface 220. In some cases, the memory system controller 215 may determine the access command has been received by retrieving the command from the command queue 260. The command may be removed from the command queue 260 after it has been retrieved therefrom, e.g., by the memory system controller 215. In some cases, the memory system controller 215 may cause the interface 220, e.g., via the bus 235, to remove the command from the command queue 260.

Upon the determination that an access command has been received, the memory system controller 215 may execute the access command. For a read command, this may mean obtaining data from the memory devices 240 and transmitting the data to the host system 205. For a write command, this may mean receiving data from the host system 205 and moving the data to the memory devices 240.

In either case, the memory system controller 215 may use the buffer 225 for, among other things, temporary storage of the data being received from or sent to the host system 205. The buffer 225 may be considered a middle end of the memory system 210. In some cases, buffer address management (e.g., pointers to address locations in the buffer 225) may be performed by hardware (e.g., dedicated circuits) in the interface 220, buffer 225, or storage controller 230.

To process a write command received from the host system 205, the memory system controller 215 may first determine if the buffer 225 has sufficient available space to store the data associated with the command. For example, the memory system controller 215 may determine, e.g., via firmware (e.g., controller firmware), an amount of space within the buffer 225 that may be available to store data associated with the write command.

In some cases, a buffer queue 265 may be used to control a flow of commands associated with data stored in the buffer 225, including write commands. The buffer queue 265 may include the access commands associated with data currently stored in the buffer 225. In some cases, the commands in the command queue 260 may be moved to the buffer queue 265 by the memory system controller 215 and may remain in the buffer queue 265 while the associated data is stored in the buffer 225. In some cases, each command in the buffer queue 265 may be associated with an address at the buffer 225. That is, pointers may be maintained that indicate where in the buffer 225 the data associated with each command is stored. Using the buffer queue 265, multiple access commands may be received sequentially from the host system 205 and at least portions of the access commands may be processed concurrently.

If the buffer 225 has sufficient space to store the write data, the memory system controller 215 may cause the interface 220 to transmit an indication of availability to the host system 205 (e.g., a "ready to transfer" indication), e.g., according to a protocol (e.g., a UFS protocol or an eMMC protocol). As the interface 220 subsequently receives from the host system 205 the data associated with the write command, the interface 220 may transfer the data to the buffer 225 for temporary storage using the data path 250. In some cases, the interface 220 may obtain from the buffer 225 or buffer queue 265 the location within the buffer 225 to store the data. The interface 220 may indicate to the memory system controller 215, e.g., via the bus 235, if the data transfer to the buffer 225 has been completed.

Once the write data has been stored in the buffer 225 by the interface 220, the data may be transferred out of the buffer 225 and stored in a memory device 240. This may be done using the storage controller 230. For example, the memory system controller 215 may cause the storage controller 230 to retrieve the data out of the buffer 225 using the data path 250 and transfer the data to a memory device 240. The storage controller 230 may be considered a back end of the memory system 210. The storage controller 230 may indicate to the memory system controller 215, e.g., via the bus 235, that the data transfer to a memory device of the memory devices 240 has been completed.

In some cases, a storage queue 270 may be used to aid with the transfer of write data. For example, the memory system controller 215 may push (e.g., via the bus 235) write commands from the buffer queue 265 to the storage queue 270 for processing. The storage queue 270 may include entries for each access command. In some examples, the storage queue 270 may additionally include a buffer pointer (e.g., an address) that may indicate where in the buffer 225 the data associated with the command is stored and a storage pointer (e.g., an address) that may indicate the location in the memory devices 240 associated with the data. In some cases, the storage controller 230 may obtain from the buffer 225, buffer queue 265, or storage queue 270 the location within the buffer 225 from which to obtain the data. The storage controller 230 may manage the locations within the memory devices 240 to store the data (e.g., performing wear-leveling, garbage collection, and the like). The entries may be added to the storage queue 270, e.g., by the memory system controller 215. The entries may be removed from the storage queue 270, e.g., by the storage controller 230 or memory system controller 215 upon completion of the transfer of the data.

To process a read command received from the host system 205, the memory system controller 215 may again first determine if the buffer 225 has sufficient available space to store the data associated with the command. For example, the memory system controller 215 may determine, e.g., via firmware (e.g., controller firmware), an amount of space within the buffer 225 that may be available to store data associated with the read command.

In some cases, the buffer queue 265 may be used to aid with buffer storage of data associated with read commands in a similar manner as discussed above with respect to write commands. For example, if the buffer 225 has sufficient space to store the read data, the memory system controller 215 may cause the storage controller 230 to retrieve the data associated with the read command from a memory device 240 and store the data in the buffer 225 for temporary storage using the data path 250. The storage controller 230 may indicate to the memory system controller 215, e.g., via the bus 235, when the data transfer to the buffer 225 has been completed.

In some cases, the storage queue 270 may be used to aid with the transfer of read data. For example, the memory system controller 215 may push the read command to the storage queue 270 for processing. In some cases, the storage controller 230 may obtain from the buffer 225 or storage queue 270 the location within the memory devices 240 from which to retrieve the data. In some cases, the storage controller 230 may obtain from the buffer queue 265 the location within the buffer 225 to store the data. In some cases, the storage controller 230 may obtain from the storage queue 270 the location within the buffer 225 to store the data. In some cases, the memory system controller 215 may move the command processed by the storage queue 270 back to the command queue 260.

Once the data has been stored in the buffer 225 by the storage controller 230, the data may be transferred out of the buffer 225 and sent to the host system 205. For example, the memory system controller 215 may cause the interface 220 to retrieve the data out of the buffer 225 using the data path 250 and transmit the data to the host system 205, e.g., according to a protocol (e.g., a UFS protocol or an eMMC protocol). For example, the interface 220 may process the command from the command queue 260 and may indicate to the memory system controller 215, e.g., via the bus 235, that the data transmission to the host system 205 has been completed.

The memory system controller 215 may execute received commands according to an order (e.g., a first-in, first-out order, according to the order of the command queue 260). For each command, the memory system controller 215 may cause data corresponding to the command to be moved into and out of the buffer 225, as discussed above. As the data is moved into and stored within the buffer 225, the command may remain in the buffer queue 265. A command may be removed from the buffer queue 265, e.g., by the memory system controller 215, if the processing of the command has been completed (e.g., if data corresponding to the access command has been transferred out of the buffer 225). If a command is removed from the buffer queue 265, the address previously storing the data associated with that command may be available to store data associated with a new command.

The memory system controller 215 may additionally be configured for operations associated with the memory devices 240. For example, the memory system controller 215 may execute or manage operations such as wear-leveling operations, garbage collection operations, error control operations such as error-detecting operations or error-correcting operations, encryption operations, caching operations, media management operations, background refresh, health monitoring, and address translations between logical addresses (e.g., LBAs) associated with commands from the host system 205 and physical addresses (e.g., physical block addresses) associated with memory cells within the memory devices 240. That is, the host system 205 may issue commands indicating one or more LBAs and the memory system controller 215 may identify one or more physical block addresses indicated by the LBAs. In some cases, one or more contiguous LBAs may correspond to noncontiguous physical block addresses. In some cases, the storage controller 230 may be configured to perform one or more of the above operations in conjunction with or instead of the memory system controller 215. In some cases, the memory system controller 215 may perform the functions of the storage controller 230 and the storage controller 230 may be omitted.

In some cases, a memory system 210 may include circuitry, such as an overvoltage detector, to monitor one or more supply voltages to the memory system 210 or voltages generated by the memory system 210 to determine whether a voltage rises above an operational range. In some cases, an overvoltage detector may include a same voltage detector circuit as an undervoltage detector that has been tuned or manufactured to have a higher threshold than an undervoltage detector used to determine whether a voltage has fallen below the operational range. Accordingly, the memory system 210 may monitor a voltage using an undervoltage detector having a threshold corresponding to a lower bound or lower operation point of the operational range of the monitored voltage and an overvoltage detector having a threshold corresponding to the upper bound or upper operational point of the operational range. Thus, the memory system 210 may determine whether a monitored voltage rises either above or below the operational range, which may allow a health engine of the memory system 210 to initiate a safe mode or take other action if an overvoltage event is detected or if an undervoltage event is detected.

Figure 3:
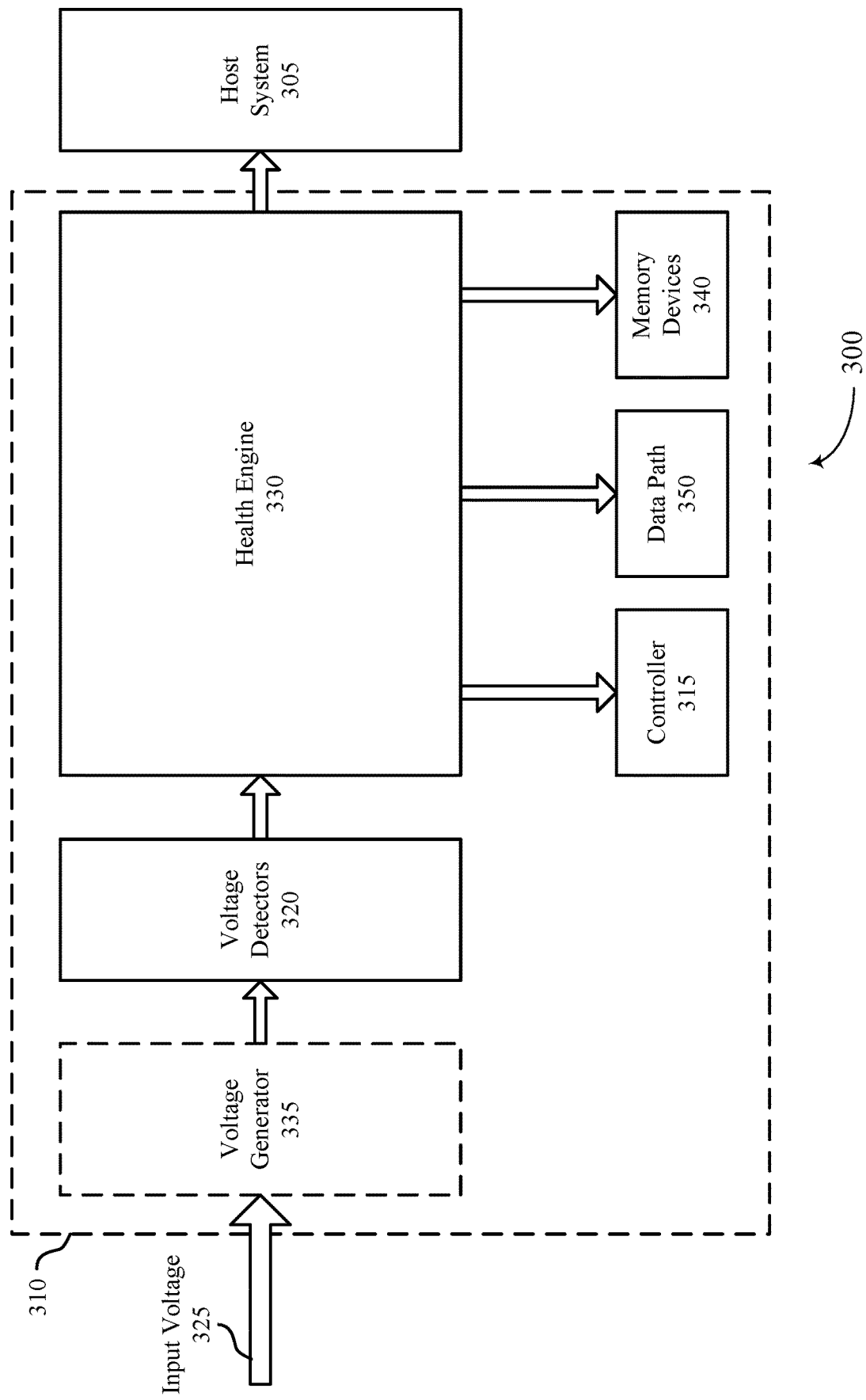
FIG. 3 illustrates an example of a block diagram that supports voltage detection for managed memory systems in accordance with examples as disclosed herein.

FIG. 3 illustrates an example of a block diagram 300 that supports voltage detection for managed memory systems in accordance with examples as disclosed herein. The block diagram 300 may include a memory system 310, which may communicate with a host system 305. The memory system 310 may be an example of the memory system 210. The host system 305 may be an example of the host system 205. The memory system 310 may perform commands received from the host system 305 using components such as a controller 315, a data path 350, and one or more memory devices 340, which may be examples of the corresponding devices or circuits described with reference to FIG. 2. In some cases, the memory devices may be examples of non-volatile memory devices, such as NAND or 3D cross-point devices. In other cases, the memory devices 340 may be examples of volatile memory devices, such a DRAM or FeRAM devices.

In some examples, the memory system 310 may include a health engine 330. In some cases, the health engine 330 may be referred to as or be an example of a safety island. In some cases, the health engine 330 may be separate component or logic of the memory system 310 (e.g., separated from other components of the memory system 310, such as the controller 315), or may be integrated into another component of the memory system 310, such as the controller 315.

The health engine 330 may perform aspects related to health monitoring of the memory system 310. For example, the health engine 330 may alert components of the memory system 310, such as the controller 315, the data path 350, or the memory devices 340, of operating conditions, such as whether an operational voltage of the memory system 310 falls out of a pre-determined or acceptable operational range. The health engine 330 may issue an indication of the operating conditions directly to the controller 315, the data path 350, or the memory devices 340, or the health engine 330 may issue the indication to an intermediary component, such as the controller 315, which may accordingly notify or take action on behalf of other components of the memory system 310. In some cases, the health engine may transmit an indication of the operation conditions to the host system 305.

The memory system 310 may include one or more voltage detectors 320. The voltage detectors 320 may monitor one or more operational or supply voltages of the memory system 310, such as an input voltage 325, to determine whether a supply voltage is out of pre-defined range, such as an operational range. In some cases, the voltage detectors 320 may issue a notification to the health engine 330 if a monitored supply voltage is out of an operational range. For example, the voltage detectors 320 may include an undervoltage detector. The undervoltage detector may be a circuit having a voltage threshold, and may take as an input a supply voltage to be monitored. The undervoltage detector may be configured to output a first logical value (e.g., a logical "0") if the monitored supply voltage is above the threshold, and may be configured to output a second logical value (e.g., a logical "1") if the supply voltage is below the threshold. Accordingly, the undervoltage detector may be configured to notify the health engine if a monitored supply voltage falls below the threshold of the undervoltage detector.

In some cases, the voltage detectors 320 may also include an overvoltage detector to determine whether a monitored supply voltage is above an operational range. The overvoltage detector may include a same voltage detector circuit as an undervoltage detector (e.g., the overvoltage detector may include a circuit configured to output the first logical value if a monitored supply voltage is above a threshold of the circuit and output the second logical value if the monitored supply voltage is below the threshold). In some cases, the overvoltage detector may invert the output of the included voltage detector, for example by using an inverter coupled with the voltage detector. Thus, the output of the overvoltage detector may be the inverted the output of the included voltage detector. Accordingly, if the monitored supply voltage is above the threshold of the voltage detector, the overvoltage detector may output the second logical value (e.g., logical "1"), and may output the first logical value (e.g., logical "0") if the monitored supply voltage is below the threshold of the undervoltage detector.

In some cases, an undervoltage detector and an overvoltage detector may be used together to determine whether a supply voltage is out of an operational range. For example, the operational range of a supply voltage may be a range of acceptable or safe values for the voltage supplied to one or more components of the memory system 310. Accordingly, the operational range may have a lower threshold (e.g., corresponding to a lower value of the operational range) and an upper threshold (e.g., corresponding to the upper value of the operational range). An undervoltage detector with a threshold corresponding to the lower threshold may be used to determine whether the supply voltage is below the operational range, while an overvoltage detector with a threshold corresponding to the upper threshold may be used the determine whether the supply voltage is above the operational range.

In some cases, different components of the memory system 310 may use different supply voltages with different operational ranges. In such cases, the memory system 310 may include a circuit, such as a voltage generator 335, to generate one or more supply voltages for the components of the memory system 310. The voltage generator 335 may receive one or more input voltages 325, for example from the host system 305, and generate one or more additional supply voltages to be used by the memory system 310. Each of the additional supply voltages may have an associated operational range. Accordingly, the voltage detectors 320 may include undervoltage detectors and overvoltage detectors for multiple supply voltages. That is, the voltage detectors 320 may include a first set of voltage detectors including an undervoltage detector and an overvoltage detector with thresholds corresponding to a first operational range of a first supply voltage, as well as a second set of voltage detectors including an undervoltage detector and an overvoltage detector with thresholds corresponding to a second operational range of a second supply voltage (e.g., generated by voltage generator 335).

In some examples, the voltage detectors 320 may issue a notification to the health engine 330 if the voltage detectors 320 determine that a supply voltage is outside of a corresponding operational range. By way of example, the notification may indicate that the supply voltage is above the operational range (e.g., that the voltage detectors 320 detected an overvoltage event). Accordingly, the health engine 330 may initiate a safe mode for the memory device.

As part of initiating the safe mode, the health engine 330 may place the controller 315 in a safe state.

In some cases, while in the safe mode, the health engine 330 may delay the transfer of data or other information between components of the memory system 310. For example, the health engine 330 may issue an indication to the memory devices 340 to delay or interrupt performing read or write commands, or to delay performing other data management operations, such as garbage collection. In some cases, the controller 315 may delay issuing commands or status checks to the memory devices 340. In some cases, the health engine 330 may issue an indication or command to interrupt an action or command being performed by or using the data path 350. Additionally or alternatively, while in the safe mode, the health engine 330 may delay the transfer of data or other information between the memory system 310 and the host system 305. For example, the health engine 330 may transmit a notification to the host system 305 that the memory system 310 is in a safe mode. Accordingly, the host system 305 may delay transmitting commands, data, or both to the memory system 310. In some case, if the memory system 310 initiated the safe mode after receiving a command for data (e.g., a read command) but before returning the data to the host system 305, the memory system 310 may delay or cease transmitting data to the host system 305 (e.g., the command may not be completed).

Figure 4:
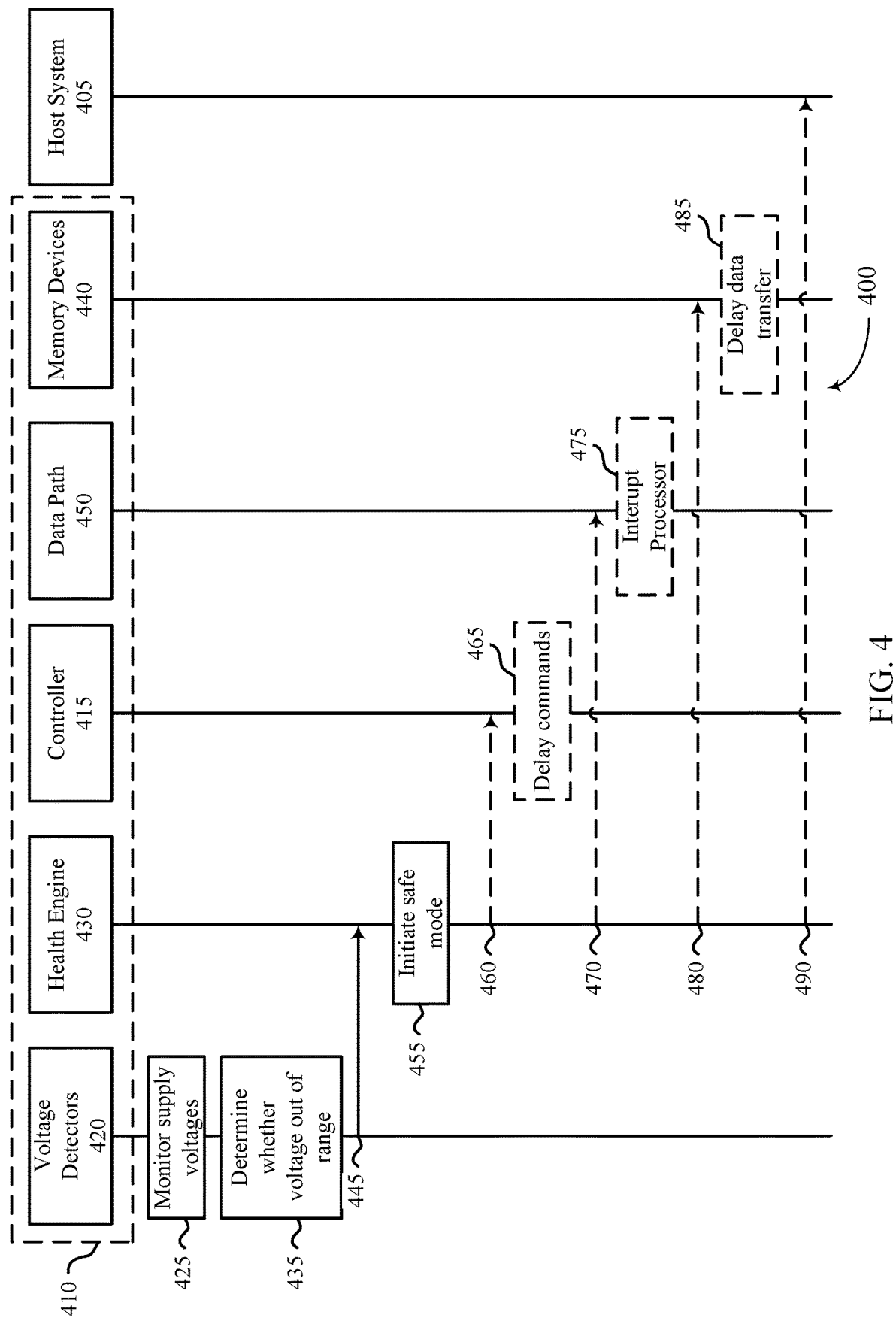
FIG. 4 illustrates an example of a flow diagram that supports voltage detection for managed memory systems in accordance with examples as disclosed herein.

FIG. 4 illustrates an example of a flow diagram 400 that supports voltage detection for managed memory systems in accordance with examples as disclosed herein. The flow diagram 400 may be implemented by a memory system 410 and host system 405, such as the memory system and host system described with reference to FIG. 1, 2, or 3. The memory system 410 may include one or more voltage detectors 420, a health engine 430, a controller 415, a data path 450, and one or more memory devices 440, which each may be examples of the corresponding devices and circuits described with reference to FIG. 3. In some examples, data path 450 may be an example of or may include buffer 225 of FIG. 2. In the following description of flow diagram 400, the operations may be performed in a different order than the order shown. For example, specific operations may also be left out of flow diagram 400, or other operations may be added to flow diagram 400.

In some examples, the flow diagram 400 may include monitoring of one or more supply voltages. For example, at 425, the voltage detectors 420 may monitor one or more supply voltages. The voltage detectors 420 may include overvoltage detectors and undervoltage detectors. In a non-limiting example, each voltage detector may be configured to take a supply voltage to be monitored as an input, and may output an indication of whether the monitored supply voltage is below or above a threshold associated with the voltage detector. For example, the voltage detectors 420 may include a first voltage detector, which may be an example of an under voltage detector, and a second voltage detector, which may be an example of an overvoltage detectors.

The first voltage detector may have a first configuration, which may include a configuration of one or more resistors. The one or more resistors may be trimmed or otherwise manufactured to have a first set of resistance values. The first voltage detector may have a first threshold that may result from or be determined from the first set of resistance values (e.g., the first threshold may be determined by the trim of the first voltage detector). Additionally or alternatively, the second voltage detector may have a second configuration, which may include the configuration on one or more resistors with a second set of resistance values. Said another way, both the first voltage detector and the second voltage detector may use a same or similar configuration of resistors, but the resistors of the first voltage detector and the resistors of the second voltage detectors may have different trims or may be trimmed by fuses, which may result in a different set of resistance values. Accordingly, the second voltage detector may have a second threshold, which may be different than the first threshold. The second voltage detector may include an inverter or other circuitry to invert the output of the second voltage detector. That is, second voltage detector may include an undervoltage detector with the second threshold, and may invert the output of the undervoltage detector to determine whether a monitored supply voltage is above the second threshold.

In some cases, the flow diagram 400 may include determining whether one or more supply voltages satisfy respective operational ranges. For example, at 435, an undervoltage detector and an overvoltage detector of the voltage detectors 420 may each monitor a supply voltage. The undervoltage detector may have a first threshold corresponding to a lower bound or value of the operational range, while the overvoltage detector may have a second threshold corresponding to an upper bound or value of the operational range. In some cases, the voltage detectors may determine that a supply voltage exceeds an upper operating point of corresponding operational range. For example, the undervoltage detector may set a first flag indicating that the supply voltage exceeds the first threshold, and the overvoltage detector may set a second flag indication that the supply voltage exceeds the second threshold. In some cases, the overvoltage detector may invert the second flag (e.g., using an inverter).

In some cases, if the voltage detectors 420 determine that at least one supply voltage is outside of the operational range (e.g., if a supply voltage is above the operational range), the flow diagram 400 may include issuing an indication that the supply voltage is outside the operational range. For example, at 445, the voltage detectors 420 may issue the indication to the health engine. In some examples, the indication transmitted to the health engine 430 may be an indication of an overvoltage event (e.g., if the voltage detectors 420 determine that the supply voltage is above the operational range). In other examples, the indication transmitted to the health engine 430 may be an indication of an undervoltage event (e.g., if the voltage detectors 420 determine that the supply voltage is below the operational range).

In some examples, the flow diagram 400 may include initiating a safe mode of the memory system 410. For example, at 455, the health engine 430 may initiate the safe mode in response to receiving an indication of an overvoltage event at 445. In some cases, while in the safe mode, the health engine 430 may delay the transfer of data or other information between components of the memory system 410.

For example, the flow diagram 400 may include issuing an indication of the safe mode to the controller 415. In some cases, at 460, the health engine 430 may issue the indication to the controller 415. In some cases, the indication may include an interrupt to the controller 415. The flow diagram 400 may include delaying one or more commands. For example, at 465, the controller 415 may delay or interrupt performing access commands, such as read or write commands, received from the host system 405. For example, if the memory system 410 receives a command from the host system 405 while in the safe mode, the controller 415 may ignore the command or delay operations related to the command (e.g., the controller 415 may leave the command in a command queue). Additionally or alternatively, other data management operations, such as garbage collection, may be paused or delayed while in the safe mode by the controller 415.

Additionally or alternatively, the flow diagram 400 may include issuing an indication of the safe mode to the data path 450. In some cases, at 470, the health engine 430 may issue the indication to the data path 450. For example, at 475, the indication may be issued or sent to the data path 450, which may delay or pause any data transfer operations. For example, the data path 450 may pause data transfer operations between the data path 450 and an interface (e.g., interface 220) or memory devices 440 of the memory system 410. In some cases, the indication at 460 or 470 may include a command to abort actions being performed in the controller 315 or in the data path 450.

In some cases, the flow diagram 400 may include issuing an indication of the safe mode to the memory devices 440. For example, at 480, the health engine 430 may issue the indication to the memory devices 440. Accordingly, at 485, performing access commands may be delayed. For example, the memory devices 440 may delay performing read or write commands received from controller 415 or a storage controller (e.g., storage controller 230 as shown in FIG. 2).

In some cases, the flow diagram 400 may include issuing an indication of the safe mode to the host system 405. For example, at 490, the health engine 430 may issue the indication to the host system 405. Accordingly, the host system 405 may delay transmitting commands, data, or both to the memory system 410. In some case, if the memory system 410 initiated the safe mode after receiving a command for data (e.g., a read command) but before returning the data to the host system 405, the memory system 410 may delay or cease transmitting data to the host system 405 (e.g., the command may not be completed).

Aspects of the flow diagram 400 may be implemented by a controller, among other components. Additionally or alternatively, aspects of the flow diagram 400 may be implemented as instructions stored in memory (e.g., firmware stored in a memory coupled with the memory system 410, the host system 405, or both). For example, the instructions, when executed by a controller, may cause the controller to perform the operations of the flow diagram 400.

Figure 5:
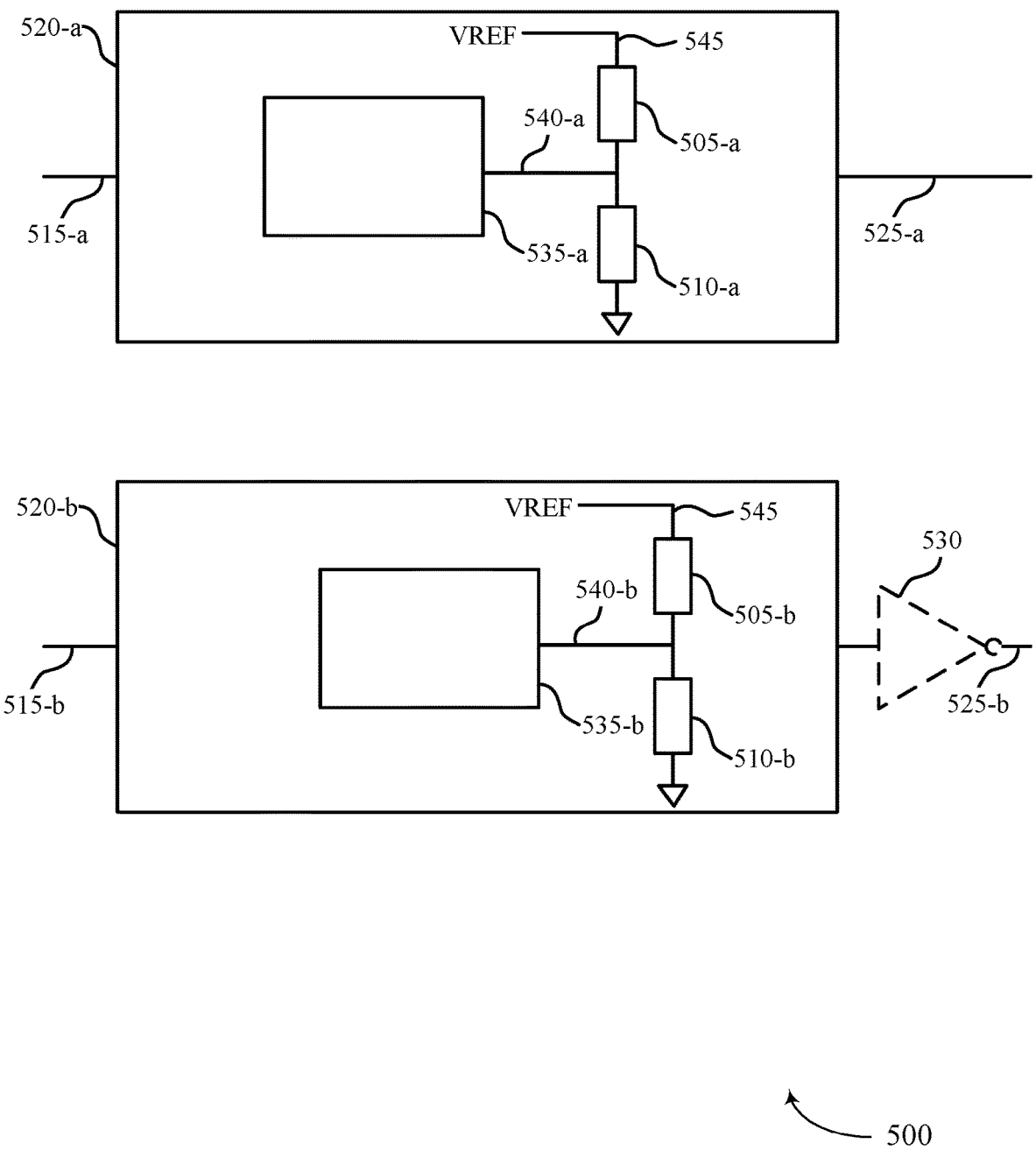
FIG. 5 illustrates an example of a block diagram that supports voltage detection for managed memory systems in accordance with examples as disclosed herein.

FIG. 5 illustrates an example of a block diagram 500 that supports voltage detection for managed memory systems in accordance with examples as disclosed herein. The block diagram 500 may be an example of an undervoltage detector 520-*a* and an overvoltage detector 520-*b*, which may be included in the voltage detectors 320 or the voltage detectors 420 as described with reference to FIGS. 3 and 4.

In some cases, the undervoltage detector 520-*a* may monitor a supply voltage of a memory system, such as the memory system 310 or the memory system 410 as described with reference to FIGS. 3 and 4. Undervoltage detector 520-*a* may monitor an input 515-*a* (e.g., a supply voltage) to determine whether the supply voltage is below a first threshold of the undervoltage detector 520-*a*. The undervoltage detector 520-*a* may generate an output 525-*a* indicating whether the monitored supply voltage is below the first threshold. For example, the output 525-*a* may be a first logical value (e.g., a logical "0") if the monitored supply voltage is above the first threshold, and may be a second logical value (e.g., a logical "1") is the monitored supply voltage is below the first threshold. In some cases, the output 525-*a* may be provided or issued to a health engine of the memory system, such as the health engine 330 or the health engine 430 as described with reference to FIGS. 3 and 4.

Undervoltage detector 520-*a* may include voltage detector circuit 535-*a*, which may detect whether the input 515-*a* is below or above a voltage that is relative to a bias voltage 540-*a*. A voltage detector circuit 535 may include a comparator which compares an input voltage to a reference voltage (e.g., a threshold voltage) and outputs an indication, such as a signal, of whether the input voltage exceeds the reference voltage. In some cases, a voltage detector circuit may include a set of resistors configured to generate the reference voltage for input to the comparator.

In some cases, the threshold of the undervoltage detector 520-*a* (e.g., the first threshold) may be determined by or depend on a configuration of the undervoltage detector. For example, the undervoltage detector 520-*a* may include a set of resistors, such as a resistor 505-*a* and a resistor 510-*a*. The configuration of the undervoltage detector 520-*a* may indicate an arrangement or trim of active or inactive resistors. For example, each of resistor 505-*a* and 505-*b* may include multiple resistors, and the configuration of the undervoltage detector 520-*a* may indicate that a subset of resistors of resistor 505-*a* or a subset of resistors of resistor 510-*a* may be active. For example, each of resistors 505-*a* and 505-*b* may include multiple resistors, and each resistor may be activated or deactivated (e.g., shorted) via a fuse or anti-fuse. In some cases, the value of the first threshold may depend on which resistors are active and which resistors are inactive, which may set bias voltage 540-*a* relative to a reference voltage 545. Accordingly, the first threshold may be determined by or depend on the configuration of the undervoltage detector 520-*a*.

Additionally or alternatively, the configuration of the undervoltage detector 520-*a* may include a trim setting or trimming of the resistor 505-*a* or the resistor 510-*a*. For example, during manufacturing, the value of the resistance of a resistor may be adjusted or tuned by trimming the resistors (e.g., using laser trimming), such as by removing or altering portions of material of the resistor. Accordingly, the resistance of the resistor 505-*a* and the resistor 510-*a* may be selected or tuned during manufacturing. In some cases, the value of the first threshold may depend on the resistance values of the resistor 505-*a* and the resistor 510-*a*. Accordingly, the first threshold may be determined by or depend on the configuration of the undervoltage detector 520-*a*.

The overvoltage detector 520-*b* may monitor the supply voltage of the memory system input to the overvoltage detector 520-*b* via an input 515-*b* to determine whether the supply voltage is above a second threshold of the overvoltage detector 520-*b*. The overvoltage detector 520-*b* may generate an output 525-*b* indicating whether the monitored supply voltage is above the second threshold. In some cases, the overvoltage detector 520-*b* may include an inverter 530 to invert the output 525-*b*. For example, the overvoltage detector 520-*b* may be configured to output the first logical value (e.g., logic "0") if the monitored supply voltage is above the second threshold, and may output the second logical value (e.g., logic "1") if the monitored supply voltage is below the second threshold. Accordingly, the inverter 530 may invert the output of the overvoltage detector 520-*b*, so that the output 525-*b* may be the second logical value (e.g., logic "1") if the monitored supply voltage is above the second threshold, and may be the first logical value (e.g., logic "0") if the monitored supply voltage is below the second threshold.

In some cases, the overvoltage detector 520-*b* may include a same or similar voltage detector circuit 535-*b* and a same or similar set of resistors, including a resistor 505-*b* and a resistor 510-*b*, as the undervoltage detector 520-*a*. For example, voltage detector circuit 535-b may have the same sizes, structures, or layouts of transistors as voltage detector circuit 535-a, and may be a copy of voltage detector circuit 535-a. In addition, resistors 505-b and 510-b may include a same quantity of resistors as resistors 505-a and 510-a respectively, and each resistor may have a same resistance value (e.g., before being trimmed or having fuses programmed). That is, the overvoltage detector 520-b and the undervoltage detector 520-a may include same or similar circuitry. However, the overvoltage detector 520-b may have a higher threshold (e.g., a second threshold) relative to the undervoltage detector 520-a. For example, the overvoltage detector 520-b may have a second configuration, such as an arrangement of active an inactive resistors different than the first configuration. Additionally or alternatively, the resistor 505-b and the resistor 510-b may have a different trim (e.g., may have been trimmed or tuned to a different resistance value during manufacturing) relative to the resistor 505-a and the resistor 510-a.

For example, during manufacturing a voltage (e.g., supply voltage input to input 515-a and 515-b) may be varied, and outputs 525-a and 525-b may be monitored to determine a configuration for resistors 505-a, 510-a, 505-b, and 510-b to provide the first threshold and the second threshold. In one example, on or more settings for fuses or anti-fuses may be configured to test the first threshold or the second threshold, and the fuses or anti-fuses may be programmed according to settings associated with desired values for the first threshold and the second threshold.

Figure 6:
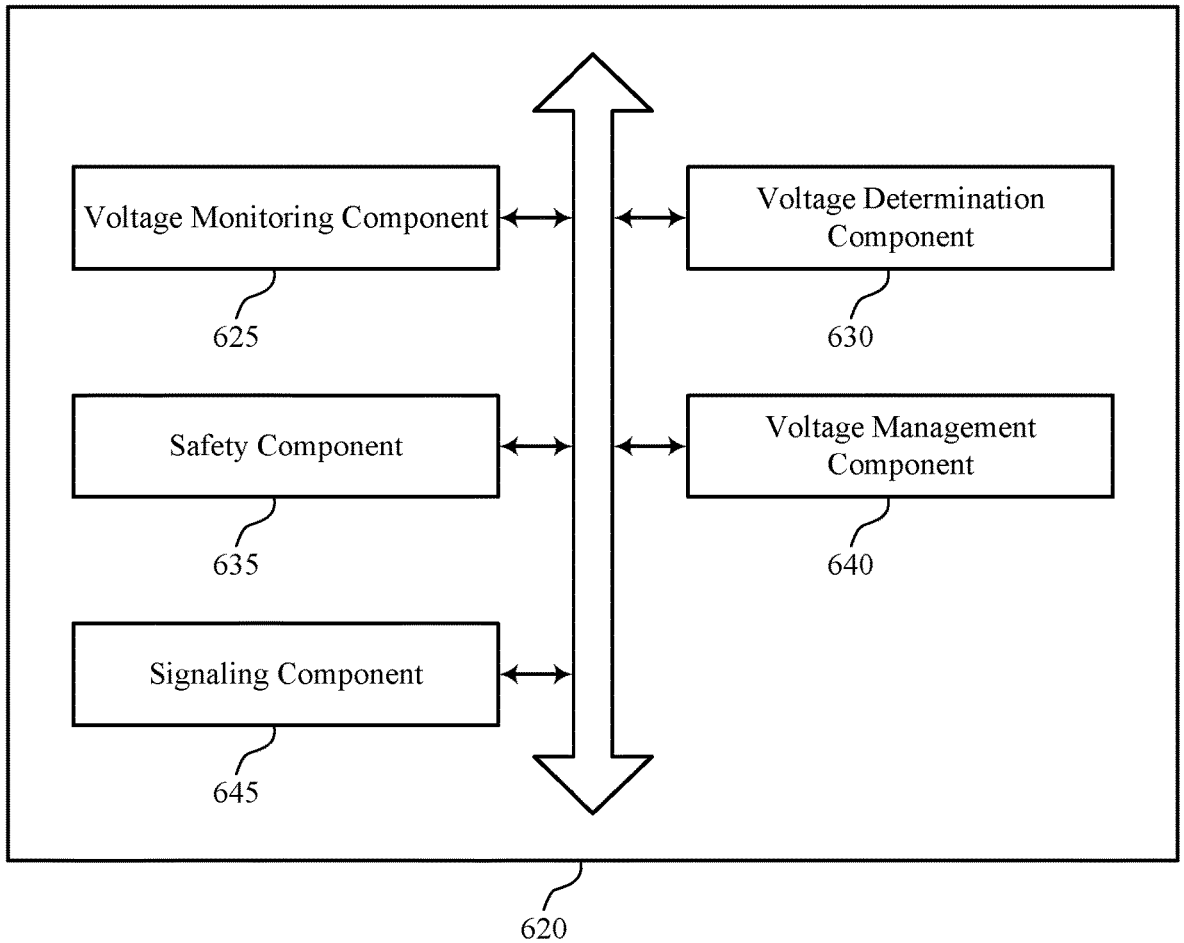
FIG. 6 shows a block diagram of a memory system that supports voltage detection for managed memory systems in accordance with examples as disclosed herein.

FIG. 6 shows a block diagram 600 of a memory system 620 that supports voltage detection for managed memory systems in accordance with examples as disclosed herein. The memory system 620 may be an example of aspects of a memory system as described with reference to FIGS. 1 through 5. The memory system 620, or various components thereof, may be an example of means for performing various aspects of voltage detection for managed memory systems as described herein. For example, the memory system 620 may include a voltage monitoring component 625, a voltage determination component 630, a safety component 635, a voltage management component 640, a signaling component 645, or any combination thereof. Each of these components may communicate, directly or indirectly, with one another (e.g., via one or more buses).

The voltage monitoring component 625 may be configured as or otherwise support a means for monitoring one or more supply voltages of a memory device. The voltage determination component 630 may be configured as or otherwise support a means for determining, using a first voltage detector having a first configuration and a second voltage detector having a second configuration, whether the one or more supply voltages satisfy respective ranges based at least in part on monitoring the one or more supply voltages. The safety component 635 may be configured as or otherwise support a means for initiating, at a health engine of the memory device and based at least in part on determining that a supply voltage of the one or more supply voltages exceeds an upper operating point of the respective range, a safe mode of the memory device.

In some examples, the voltage determination component 630 may be configured as or otherwise support a means for setting a first flag indicating that the supply voltage exceeds a first threshold of the first voltage detector. In some examples, the voltage determination component 630 may be configured as or otherwise support a means for setting a second flag indicating that the supply voltage exceeds a second threshold of the second voltage detector. In some examples, the voltage management component 640 may be configured as or otherwise support a means for inverting the second flag, where determining that the supply voltage exceeds the upper operating point of the respective range is based at least in part on inverting the second flag.

In some examples, the signaling component 645 may be configured as or otherwise support a means for issuing an indication of the one or more supply voltages to the health engine of the memory device.

In some examples, the signaling component 645 may be configured as or otherwise support a means for transmitting an indication of the safe mode to a host device based at least in part on determining that the supply voltage exceeds the upper operating point of the respective range.

In some examples, the signaling component 645 may be configured as or otherwise support a means for issuing an indication of the safe mode from the health engine to a controller of the memory device based at least in part on determining that the supply voltage exceeds the upper operating point of the respective range.

In some examples, the signaling component 645 may be configured as or otherwise support a means for sending an interrupt to the processor based at least in part on determining that the supply voltage exceeds the upper operating point of the respective range.

In some examples, the safety component 635 may be configured as or otherwise support a means for delaying a transfer of data between the memory device and a host device based at least in part on determining that the supply voltage exceeds the upper operating point of the respective range.

In some examples, the first voltage detector and the second voltage detector include a respective plurality of resistors. In some examples, the first configuration includes a first subset of active resistors of the respective plurality of resistors and the second configuration includes a second subset of active resistors of the respective plurality of resistors.

In some examples, the voltage management component 640 may be configured as or otherwise support a means for receiving a first supply voltage of the one or more supply voltages. In some examples, the voltage management component 640 may be configured as or otherwise support a means for receiving a second supply voltage of the one or more supply voltages. In some examples, the voltage management component 640 may be configured as or otherwise support a means for generating one or more additional supply voltages of the one or more supply voltages using the second supply voltage, where each additional supply voltage of the one or more additional supply voltages is less than the second supply voltage.

In some examples, the voltage monitoring component 625 may be configured as or otherwise support a means for monitoring the one or more additional supply voltages. In some examples, the voltage determination component 630 may be configured as or otherwise support a means for determining whether the one or more additional supply voltages satisfy respective ranges based at least in part on monitoring the one or more additional supply voltages.

Figure 7:
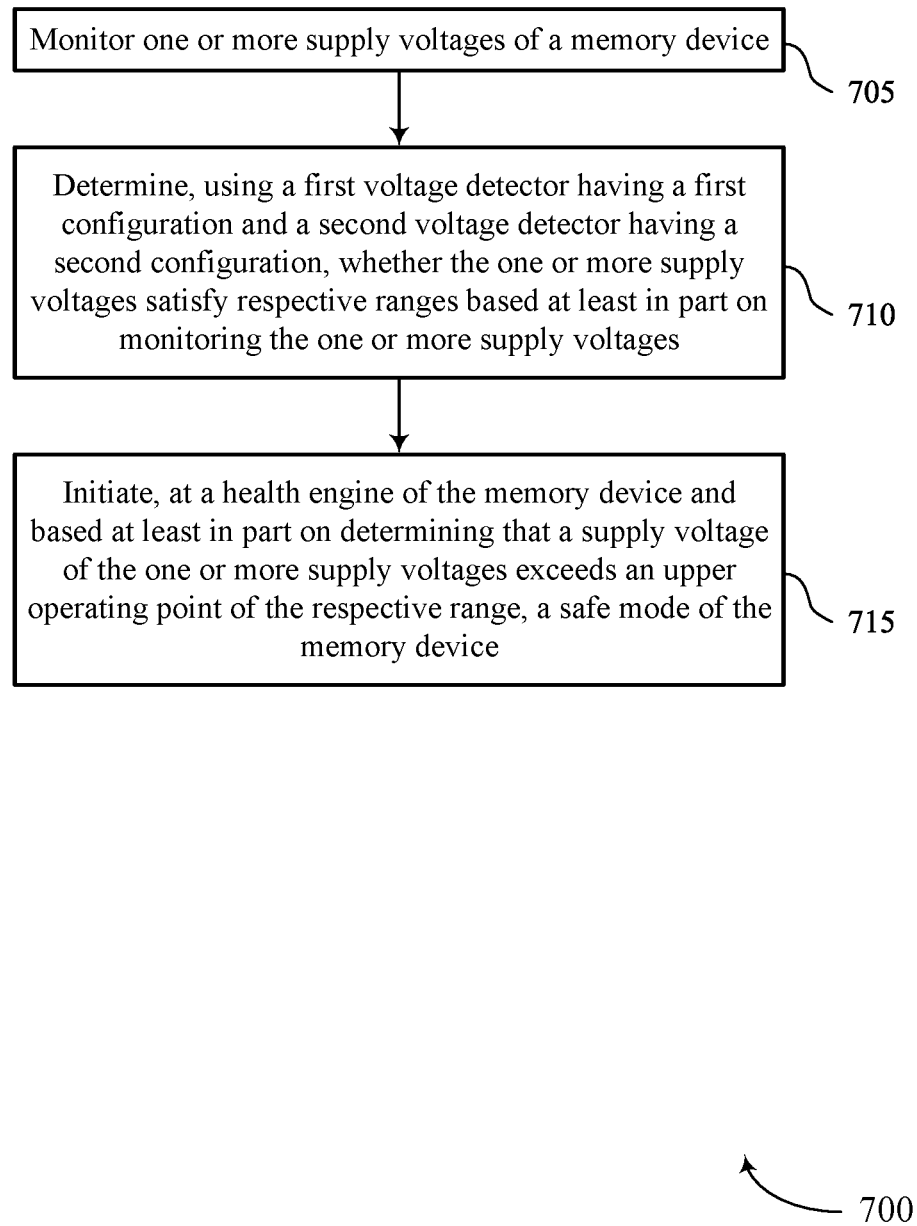
FIG. 7 shows a flowchart illustrating a method or methods that support voltage detection for managed memory systems in accordance with examples as disclosed herein.

FIG. 7 shows a flowchart illustrating a method 700 that supports voltage detection for managed memory systems in accordance with examples as disclosed herein. The operations of method 700 may be implemented by a memory system or its components as described herein. For example, the operations of method 700 may be performed by a memory system as described with reference to FIGS. 1 through 6. In some examples, a memory system may execute a set of instructions to control the functional elements of the device to perform the described functions. Additionally or alternatively, the memory system may perform aspects of the described functions using special-purpose hardware.

At 705, the method may include monitoring one or more supply voltages of a memory device. The operations of 705 may be performed in accordance with examples as disclosed herein. In some examples, aspects of the operations of 705 may be performed by a voltage monitoring component 625 as described with reference to FIG. 6.

At 710, the method may include determining, using a first voltage detector having a first configuration and a second voltage detector having a second configuration, whether the one or more supply voltages satisfy respective ranges based at least in part on monitoring the one or more supply voltages. The operations of 710 may be performed in accordance with examples as disclosed herein. In some examples, aspects of the operations of 710 may be performed by a voltage determination component 630 as described with reference to FIG. 6.

At 715, the method may include initiating, at a health engine of the memory device and based at least in part on determining that a supply voltage of the one or more supply voltages exceeds an upper operating point of the respective range, a safe mode of the memory device. The operations of 715 may be performed in accordance with examples as disclosed herein. In some examples, aspects of the operations of 715 may be performed by a safety component 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for monitoring one or more supply voltages of a memory device; determining, using a first voltage detector having a first configuration and a second voltage detector having a second configuration, whether the one or more supply voltages satisfy respective ranges based at least in part on monitoring the one or more supply voltages; and initiating, at a health engine of the memory device and based at least in part on determining that a supply voltage of the one or more supply voltages exceeds an upper operating point of the respective range, a safe mode of the memory device.

Aspect 2: The apparatus of aspect 1, further including operations, features, circuitry, logic, means, or instructions, or any combination thereof for setting a first flag indicating that the supply voltage exceeds a first threshold of the first voltage detector; setting a second flag indicating that the supply voltage exceeds a second threshold of the second voltage detector; and inverting the second flag, where determining that the supply voltage exceeds the upper operating point of the respective range is based at least in part on inverting the second flag.

Aspect 3: The apparatus of any of aspects 1 through 2, further including operations, features, circuitry, logic, means, or instructions, or any combination thereof for issuing an indication of the one or more supply voltages to the health engine of the memory device.

Aspect 4: The apparatus of any of aspects 1 through 3, further including operations, features, circuitry, logic, means, or instructions, or any combination thereof for transmitting an indication of the safe mode to a host device based at least in part on determining that the supply voltage exceeds the upper operating point of the respective range.

Aspect 5: The apparatus of any of aspects 1 through 4, further including operations, features, circuitry, logic, means, or instructions, or any combination thereof for issuing an indication of the safe mode from the health engine to a controller of the memory device based at least in part on determining that the supply voltage exceeds the upper operating point of the respective range.

Aspect 6: The apparatus of any of aspects 1 through 5, further including operations, features, circuitry, logic, means, or instructions, or any combination thereof for sending an interrupt to the processor based at least in part on determining that the supply voltage exceeds the upper operating point of the respective range.

Aspect 7: The apparatus of any of aspects 1 through 6, further including operations, features, circuitry, logic, means, or instructions, or any combination thereof for delaying a transfer of data between the memory device and a host device based at least in part on determining that the supply voltage exceeds the upper operating point of the respective range.

Aspect 8: The apparatus of any of aspects 1 through 7, further including operations, features, circuitry, logic, means, or instructions, or any combination thereof for the first voltage detector and the second voltage detector include a respective plurality of resistors and the first configuration includes a first subset of active resistors of the respective plurality of resistors and the second configuration includes a second subset of active resistors of the respective plurality of resistors.

Aspect 9: The apparatus of any of aspects 1 through 8, further including operations, features, circuitry, logic, means, or instructions, or any combination thereof for receiving a first supply voltage of the one or more supply voltages; receiving a second supply voltage of the one or more supply voltages; and generating one or more additional supply voltages of the one or more supply voltages using the second supply voltage, where each additional supply voltage of the one or more additional supply voltages is less than the second supply voltage.

Aspect 10: The apparatus of aspect 9, further including operations, features, circuitry, logic, means, or instructions, or any combination thereof for monitoring the one or more additional supply voltages and determining whether the one or more additional supply voltages satisfy respective ranges based at least in part on monitoring the one or more additional supply voltages.

It should be noted that the methods described above describe possible implementations, and that the operations and the steps may be rearranged or otherwise modified and that other implementations are possible. Further, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to a condition of moving from an open-circuit relationship between components in which signals are not presently capable of being communicated between the components over a conductive path to a closed-circuit relationship between components in which signals are capable of being communicated between components over the conductive path. If a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other if the switch is open. If a controller isolates two components, the controller affects a change that prevents signals from flowing between the components using a conductive path that previously permitted signals to flow.

The terms "if," "when," "based on," or "based at least in part on" may be used interchangeably. In some examples, if the terms "if," "when," "based on," or "based at least in part on" are used to describe a conditional action, a conditional process, or connection between portions of a process, the terms may be interchangeable.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In some other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as an n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" if a voltage greater than or equal to the transistor's threshold voltage is applied to the transistor gate. The transistor may be "off" or "deactivated" if a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration" and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a hyphen and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over, as one or more instructions or code, a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and components described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk, and Blu-ray disc, where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. An apparatus, comprising:
   a memory device;
   a controller coupled with the memory device, the controller configured to be coupled with a host device and to perform mapping between logical addresses received from the host device and physical addresses of the memory device;
   a first voltage detector having a first configuration and a second voltage detector having a second configuration, the first voltage detector and the second voltage detector coupled with the memory device and configured to monitor one or more supply voltages of the memory device and determine whether the one or more supply voltages satisfy respective ranges based at least in part on monitoring the one or more supply voltages; and
   a health engine coupled with the first voltage detector, the second voltage detector, and the controller, the health engine configured to initiate, based at least in part on determining that a supply voltage of the one or more supply voltages exceeds an upper operating point of the respective range, a safe mode of at least one of the controller or the memory device.

2. The apparatus of claim 1, wherein:
   the first voltage detector is configured to set a first flag indicating that the supply voltage exceeds a first threshold of the first voltage detector;
   the second voltage detector is configured to set a second flag indicating that the supply voltage exceeds a second threshold of the second voltage detector; and
   the second voltage detector is configured to invert the second flag, wherein determining that the supply voltage exceeds the upper operating point of the respective range is based at least in part on inverting the second flag.

3. The apparatus of claim 1, wherein the first voltage detector and the second voltage detector are configured to issue an indication of the one or more supply voltages to the health engine.

4. The apparatus of claim 1, wherein, to initiate the safe mode, the health engine is configured to transmit an indication of the safe mode to the host device based at least in part on determining that the supply voltage exceeds the upper operating point of the respective range.

5. The apparatus of claim 1, wherein the controller comprises a processor and code executable by the processor.

6. The apparatus of claim 5, wherein, to initiate the safe mode, the health engine is further configured to send an interrupt to the processor based at least in part on determining that the supply voltage exceeds the upper operating point of the respective range.

7. The apparatus of claim 5, wherein, to initiate the safe mode, the health engine is further configured to set a flag accessible by the code based at least in part on determining that the supply voltage exceeds the upper operating point of the respective range.

8. The apparatus of claim 1, wherein, to initiate the safe mode, the health engine is further configured to delay a transfer of data between the memory device and the host device based at least in part on determining that the supply voltage exceeds the upper operating point of the respective range.

9. The apparatus of claim 1, wherein the first voltage detector and the second voltage detector comprise a respective plurality of resistors, wherein the first configuration comprises a first subset of active resistors of the respective plurality of resistors and the second configuration comprises a second subset of active resistors of the respective plurality of resistors.

10. The apparatus of claim 1, wherein the controller is configured to:
    receive the one or more supply voltages; and
    generate one or more additional supply voltages using the one or more supply voltages.

11. The apparatus of claim 10, wherein a third voltage detector and a fourth voltage detector are further configured to monitor the one or more additional supply voltages and determine whether the one or more additional supply voltages satisfy respective ranges based at least in part on monitoring the one or more additional supply voltages.

12. The apparatus of claim 1, wherein a circuit block of the first voltage detector matches a circuit block of the second voltage detector.

13. A non-transitory computer-readable medium storing code comprising instructions which, when executed by a processor of an electronic device, cause the electronic device to:

monitor one or more supply voltages of a memory device;

determine, using a first voltage detector having a first configuration and a second voltage detector having a second configuration, whether the one or more supply voltages satisfy respective ranges based at least in part on monitoring the one or more supply voltages; and initiate, at a health engine of the memory device and based at least in part on determining that a supply voltage of the one or more supply voltages exceeds an upper operating point of the respective range, a safe mode of the memory device.

14. The non-transitory computer-readable medium of claim 13, wherein the instructions, when executed by the processor of the electronic device, further cause the electronic device to:

set a first flag indicating that the supply voltage exceeds a first threshold of the first voltage detector;

set a second flag indicating that the supply voltage exceeds a second threshold of the second voltage detector; and invert the second flag, wherein determining that the supply voltage exceeds the upper operating point of the respective range is based at least in part on inverting the second flag.

15. The non-transitory computer-readable medium of claim 13, wherein the instructions, when executed by the processor of the electronic device, further cause the electronic device to:

issue an indication of the one or more supply voltages to the health engine of the memory device.

16. The non-transitory computer-readable medium of claim 13, wherein, to initiate the safe mode, the instructions, when executed by the processor of the electronic device, further cause the electronic device to:

transmit an indication of the safe mode to a host device based at least in part on determining that the supply voltage exceeds the upper operating point of the respective range.

17. The non-transitory computer-readable medium of claim 13, wherein, to initiate the safe mode, the instructions, when executed by the processor of the electronic device, further cause the electronic device to:

issue an indication of the safe mode from the health engine to a controller of the memory device based at least in part on determining that the supply voltage exceeds the upper operating point of the respective range.

18. The non-transitory computer-readable medium of claim 13, wherein, to initiate the safe mode, the instructions, when executed by the processor of the electronic device, further cause the electronic device to:

send an interrupt to the processor based at least in part on determining that the supply voltage exceeds the upper operating point of the respective range.

19. The non-transitory computer-readable medium of claim 13, wherein, to initiate the safe mode, the instructions, when executed by the processor of the electronic device, further cause the electronic device to:

delay a transfer of data between the memory device and a host device based at least in part on determining that the supply voltage exceeds the upper operating point of the respective range.

20. The non-transitory computer-readable medium of claim 13, wherein the first voltage detector and the second voltage detector comprise a respective plurality of resistors, wherein the first configuration comprises a first subset of active resistors of the respective plurality of resistors and the second configuration comprises a second subset of active resistors of the respective plurality of resistors.

21. The non-transitory computer-readable medium of claim 13, wherein the instructions, when executed by the processor of the electronic device, further cause the electronic device to:

receive the one or more supply voltages; and generate one or more additional supply voltages using the one or more supply voltages.

22. The non-transitory computer-readable medium of claim 21, wherein the instructions, when executed by the processor of the electronic device, further cause the electronic device to:

monitoring the one or more additional supply voltages; and determining whether the one or more additional supply voltages satisfy respective ranges based at least in part on monitoring the one or more additional supply voltages.

23. A method, comprising:

monitoring one or more supply voltages of a memory device;

determining, using a first voltage detector having a first configuration and a second voltage detector having a second configuration, whether the one or more supply voltages satisfy respective ranges based at least in part on monitoring the one or more supply voltages; and initiating, at a health engine of the memory device and based at least in part on determining that a supply voltage of the one or more supply voltages exceeds an upper operating point of the respective range, a safe mode of the memory device.

24. The method of claim 23, further comprising:

setting a first flag indicating that the supply voltage exceeds a first threshold of the first voltage detector;

setting a second flag indicating that the supply voltage exceeds a second threshold of the second voltage detector; and inverting the second flag, wherein determining that the supply voltage exceeds the upper operating point of the respective range is based at least in part on inverting the second flag.

25. The method of claim 23, further comprising:

issuing an indication of the one or more supply voltages to the health engine of the memory device.

* * * * *